(12) United States Patent
Noguchi

(10) Patent No.: US 11,815,437 B2
(45) Date of Patent: Nov. 14, 2023

(54) METHOD OF ACQUIRING SAMPLE FOR EVALUATION OF SIC SINGLE CRYSTAL

(71) Applicant: SHOWA DENKO K.K., Tokyo (JP)

(72) Inventor: Shunsuke Noguchi, Hikone (JP)

(73) Assignee: Resonac Corporation, Tokyo (JP)

( * ) Notice: Subject to any disclaimer, the term of this patent is extended or adjusted under 35 U.S.C. 154(b) by 854 days.

(21) Appl. No.: 16/702,180

(22) Filed: Dec. 3, 2019

(65) Prior Publication Data

US 2020/0182752 A1    Jun. 11, 2020

(30) Foreign Application Priority Data

Dec. 5, 2018    (JP) .................................. 2018-227984

(51) Int. Cl.
| | |
|---|---|
| *G01N 1/04* | (2006.01) |
| *G01N 1/32* | (2006.01) |
| *G01N 23/205* | (2018.01) |
| *G01N 23/2055* | (2018.01) |
| *C30B 29/36* | (2006.01) |
| *G01N 1/28* | (2006.01) |

(52) U.S. Cl.
CPC ............. *G01N 1/04* (2013.01); *G01N 1/32* (2013.01); *G01N 23/205* (2013.01); *G01N 23/2055* (2013.01); *C30B 29/36* (2013.01); *G01N 2001/2873* (2013.01)

(58) Field of Classification Search
CPC .... G01N 1/04; G01N 1/32; G01N 2001/2873; G01N 23/205; G01N 23/2055
See application file for complete search history.

(56) References Cited

U.S. PATENT DOCUMENTS

| | | | |
|---|---|---|---|
| 4,912,064 A | 3/1990 | Kong et al. | |
| 2002/0064575 A1* | 5/2002 | Miyakawa | ....... B29D 11/00009 425/808 |
| 2013/0280466 A1 | 10/2013 | Zwieback et al. | |
| 2018/0282902 A1* | 10/2018 | Nakabayashi | .......... C30B 29/36 |
| 2020/0316724 A1* | 10/2020 | Donofrio | .......... H01L 21/02013 |

FOREIGN PATENT DOCUMENTS

| | | |
|---|---|---|
| CN | 102057084 A | 5/2011 |
| CN | 104024492 A | 9/2014 |
| CN | 104350186 A | 2/2015 |
| CN | 104471118 A | 3/2015 |
| CN | 105525350 A | 4/2016 |
| CN | 108026663 A | 5/2018 |
| CN | 108138359 A | 6/2018 |
| JP | 2007-230823 A | 9/2007 |
| JP | 2010-247305 A | 11/2010 |
| JP | 2015-188003 A | 10/2015 |
| JP | 2016-52961 A | 4/2016 |
| WO | 2017/188380 A1 | 11/2017 |

* cited by examiner

*Primary Examiner* — Matthew D Krcha
*Assistant Examiner* — Tingchen Shi
(74) *Attorney, Agent, or Firm* — Sughrue Mion, PLLC

(57) ABSTRACT

A method of acquiring a sample for evaluation of a SiC single crystal, comprising: a step of cutting a SiC ingot in a radial direction at a thickness position, which is located in a range from a curved surface which forms a distal end surface in a crystal growth direction to a seed crystal, to obtain a head member which includes the curved surface, wherein the SiC ingot used in the step is a SiC ingot in which SiC thereof is crystal-grown from a seed crystal along a c axis direction; and a step of polishing a silicon surface of the head member to obtain a sample for evaluation.

9 Claims, 2 Drawing Sheets

METHOD OF ACQUIRING SAMPLE FOR EVALUATION OF SIC SINGLE CRYSTAL

BACKGROUND OF THE INVENTION

Field of the Invention

The present invention relates to a method of acquiring a sample for evaluation of a SiC single crystal used in the evaluation of a SiC single crystal.

Priority is claimed on Japanese Patent Application No. 2018-227984, filed on Dec. 5, 2018, the content of which is incorporated herein by reference.

Description of Related Art

A dielectric breakdown field of silicon carbide (SiC) is larger by one digit and a band gap thereof is three times larger than those of silicon (Si). In addition, silicon carbide (SiC) has characteristics in which a thermal conductivity is approximately three times higher than that of silicon (Si). The application of silicon carbide (SiC) to a power device, a high-frequency device, and a high-temperature operating device is expected.

A SiC epitaxial wafer in which an epitaxial film is formed on a SiC wafer is used in a device such as a semiconductor. An epitaxial film provided by chemical vapor deposition (CVD) on a SiC wafer is an active region of a SiC semiconductor device.

Therefore, a high-quality SiC wafer with reduced defects and without damages such as cracks is required. In order to obtain such a high-quality SiC wafer, evaluation of quality is performed in each step.

For example, the quality of a SiC ingot is evaluated by a nondestructive inspection such as X-ray topography (XRT) analysis and a destructive inspection such as KOH etching, after cutting a wafer for evaluation (for example, see JP2015-188003A). In order to more accurately evaluate a dislocation density and a dislocation distribution of the SiC ingot, it is necessary to perform an etch pit inspection by etching which is the destructive inspection. In a case where the number of SiC wafers and the number of seed crystals are determined after sufficiently evaluating the quality of the SiC ingot are determined, the loss amount of the SiC single crystal can be decreased.

CITATION LIST

Patent Literature

Patent Document 1: Japanese Unexamined Patent Application, First Publication No. 2015-188003A

SUMMARY OF THE INVENTION

In related art, in the quality evaluation of the SiC ingot, a head portion including a curved surface, which is a crystal growth surface of the ingot on a distal end side, was removed, and then a wafer for evaluation was cut out from a distal end or a proximal end of a region (hereinafter, referred to as a truncated cone portion) from which the SiC wafers are cut out as a product.

However, the quality of the SiC ingot tends to be improved toward the distal end in a crystal growth direction. Accordingly, when the wafer for evaluation which is used in the destructive inspection is cut out from the distal end of the truncated cone portion where the high-quality SiC wafer can be obtained, a large loss is caused in the manufacturing of the SiC wafer.

The invention is made in view of such circumstances, and an object thereof is to provide a method of acquiring a sample for evaluation of a SiC single crystal, wherein the method is capable of acquiring a sample for evaluation of a SiC single crystal without reducing a yield of a SiC wafer.

In order to achieve the object, the invention provides the following method of acquiring a sample for evaluation of a SiC single crystal.

That is, according to a first aspect of the invention, there is provided a method of acquiring a sample for evaluation of a SiC single crystal, comprising: a step of cutting a SiC ingot in a radial direction at a thickness position, which is located in a range from a curved surface which forms a distal end surface in a crystal growth direction to a seed crystal, to obtain a head member which includes the curved surface, wherein the SiC ingot used in the step is a SiC ingot in which SiC thereof is crystal-grown from a seed crystal along a c axis direction; and a step of polishing a silicon surface of the head member to obtain a sample for evaluation.

The method of acquiring a sample for evaluation of a SiC single crystal according to the first aspect of the present invention preferably includes the following characteristics. Regarding the following characteristics, a combination of two or more characteristics is also preferable.

In the method of the present invention, the thickness position may be located to be closer to the seed crystal than a position where a diameter of the SiC ingot starts to be reduced toward the crystal growth direction.

In the method of the present invention, distance from the distal end of the curved surface to the thickness position in a crystal growth direction may be included in a length range of 1% or more and 30% or less with respect to a total length of the SiC single crystal which is a length between the distal end of the curved surface and the seed crystal.

The method of the present invention may further include a step of grinding an outer periphery of the SiC ingot as a pre-step which is performed before the step which is performed to obtain the head member.

The method of the present invention may further include a step of grinding a portion including the distal end of the curved surface to form a flat surface.

The method of the present invention may further include a step of loading the sample for evaluation on a sample supporting member including a supporting surface having a shape of the curved surface.

According to the present invention, it is possible to provide a method of acquiring a sample for evaluation of a SiC single crystal, wherein the method is capable of acquiring a sample for evaluation of a SiC single crystal without reducing a yield of a SiC wafer.

DETAILED DESCRIPTION OF THE INVENTION

Hereinafter, a method of acquiring a sample for evaluation of a SiC single crystal of one embodiment of the invention will be described with reference to the drawings.

The embodiment shown below are specifically described for easier understanding of a gist of the invention, and the invention is not limited, unless otherwise noted.

The drawings used in the following description may be shown with enlarged main parts for convenience's sake, for easy understanding of the characteristics of the invention, and dimension, ratios and the like of each constituent element may not be the same as actual values.

In the following description, the order, the size, the position, the number, the shape, the material, the configurations and the like can be added, omitted, replaced, and changed within a range not departing from the gist of the invention.

First, a preferred example of a manufacturing step of a SiC single crystal used in the method of acquiring a sample for evaluation of a SiC single crystal of the present invention will be described.

Figure 1:
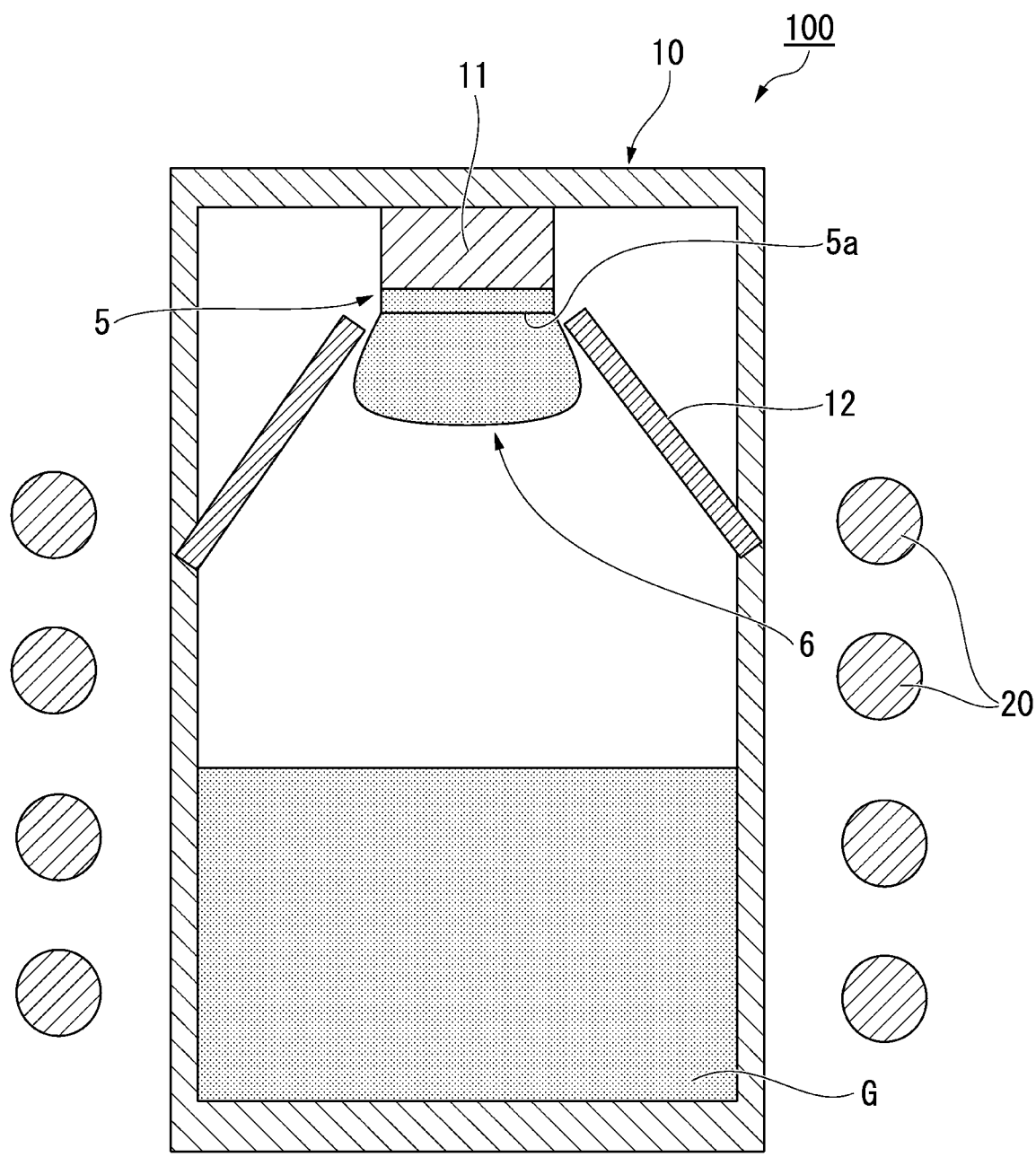
FIG. 1 is a schematic view showing a preferable example of a manufacturing device of a SiC ingot.

FIG. 1 is a schematic view showing an example of a manufacturing device of a SiC ingot.

A manufacturing device 100 of a SiC ingot is a manufacturing device of a SiC single crystal using a sublimation method, and can obtain a large single crystal (ingot) such that a raw material gas generated by heating a raw material is re-crystallized on a single crystal (seed crystal).

In the following description, a SiC single crystal to be grown is a single crystal 4H—SiC. In the following description, one surface for growing the single crystal 4H—SiC is referred to as a carbon surface (C surface) and the other surface is referred to as a silicon surface (Si surface). In a head member, a curved surface where the growth has been performed recently may be understood as the carbon surface (C surface). In the head member, a surface where the cutting of a truncated cone portion may be understood as the silicon surface (Si surface).

The manufacturing device 100 includes a crucible 10 and a coil 20. A heating element (not shown) which generates heat by induction heating of the coil 20 may be provided between the crucible 10 and the coil 20.

The crucible 10 includes a crystal installation portion 11 provided at a position facing a raw material G. The crucible 10 may include a tapered guide 12 which has a diameter expanding from the crystal installation portion 11 toward the raw material G therein.

In FIG. 1, for easy understanding, the raw material G, a seed crystal 5, and a SiC ingot 6 grown from the seed crystal are shown at the same time, but this state may not be observed during the actual manufacturing.

In a case where an alternating current is applied to the coil 20, the crucible 10 is heated and a raw material gas is generated from the raw material G. The generated raw material gas is supplied to the seed crystal 5 which is installed in the crystal installation portion 11 along the tapered guide 12. By supplying the raw material gas to the seed crystal 5, the SiC ingot (SiC single crystal) 6 is crystal-grown on a main surface (crystal growth surface) 5a of the seed crystal 5. The main surface 5a of the seed crystal 5 is preferably, for example, a carbon surface or a surface where an off angle equal to or smaller than 10° is provided form the carbon surface.

Next, the method of acquiring a sample for evaluation of a SiC single crystal of the present invention using the SiC ingot 6, which is obtained by the manufacturing device 100 which forms the SiC ingot described above, will be described.

Figure 2:
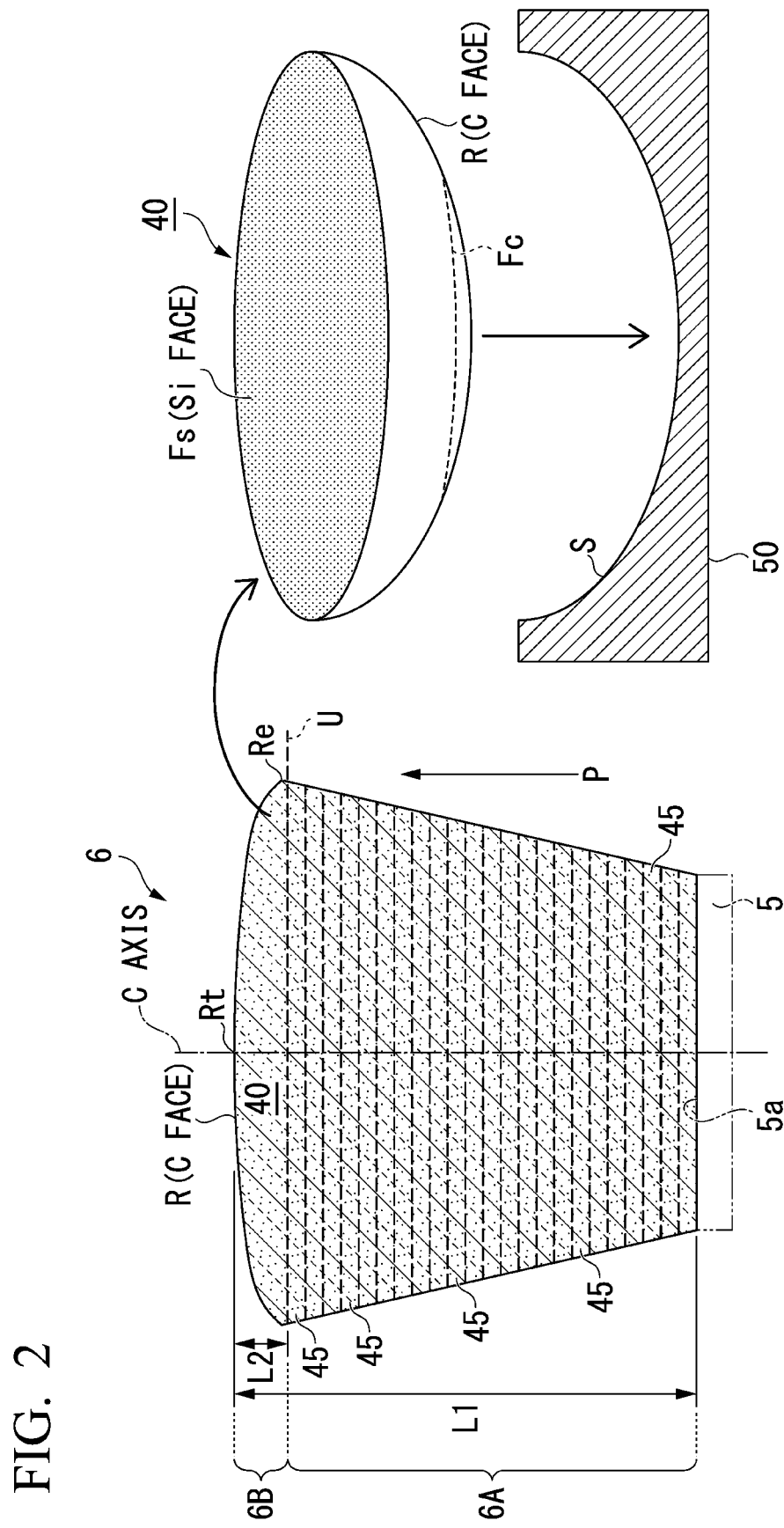
FIG. 2 is a schematic view showing a preferable example of a SiC ingot (SiC single crystal).

FIG. 2 is a schematic view showing a preferable example of the SiC ingot (SiC single crystal).

The SiC ingot shown in FIG. 2 is obtained by the crystal growth along a c axis direction and is reverse to a state of FIG. 1 from the lower side toward the upper side.

The SiC ingot (SiC single crystal) 6 manufactured by the manufacturing device 100 is in a state wherein the ingot is cut and separated from the seed crystal 5 (see FIG. 1), and is formed of a truncated cone portion 6A having a diameter expanding along a crystal growth direction P, and a head portion 6B which is integrally connected to this truncated cone portion 6A and includes a curved surface R forming a distal end surface in the crystal growth direction P.

The truncated cone portion 6A is a portion from which a SiC wafer 45 to be a product is cut out, and as it is close to the curved surface R in the crystal growth direction P, the crystal properties such as crystal dislocation tend to be improved.

The head portion 6B is a portion to which a termination process of the SiC ingot 6, which is grown to have a predetermined length, was performed, and the end surface thereof forms the curved surface R protruded in a dish shape. This curved surface R is a carbon surface (C surface). A diameter of the head portion 6B rapidly decreases as it is separated from the truncated cone portion 6A, and accordingly, the SiC wafer 45 to be a product may not be cut out from the head portion.

In the method of acquiring a sample for evaluation of a SiC single crystal of the embodiment, a head member 40, which is obtained by cutting out a portion including the head portion 6B from the SiC ingot 6, is used for a sample for evaluation. In a case of obtaining the head member 40, the SiC ingot 6 is cut in a radial direction at a predetermined thickness position U, which is included in a range from the curved surface R, which forms the distal end surface in the crystal growth direction P, to the seed crystal 5 (see FIG. 1). Accordingly, the head member 40 which includes the head portion 6B having the curved surface R is obtained. The predetermined thickness position may mean a predetermined height position or length position. The predetermined thickness position is located in a range from the curved surface forming the distal end surface in the crystal growth direction to the seed crystal.

As a pre-step performed before the step of obtaining the head member 40, a step of grinding an outer periphery of the SiC ingot may be included. Due to the step, before cutting out the head member, it is possible properly to know a region which forms the head member 40, where the SiC wafer having a desired wafer diameter cannot be acquired.

The thickness position U, which is used in a case of cutting out the portion including the head portion 6B from the SiC ingot 6, can be set, for example, such that distance toward the seed crystal 5 from a distal end Rt of the curved surface R to the thickness position is a length L2 which is 1% or more and 30% or less with respect to a total length L1 of the SiC ingot 6 which is the length between the distal end Rt of the curved surface R and the main surface 5a of the seed crystal 5. The thickness position may be located at a position to have the length from the distal end which is 1% or more and 20% or less, 1% or more and 10% or less, 1% or more and 5% or less, or 1% or more and 3% or less with respect to the total length L1.

For example, the thickness position U is preferably located closer to a position where a diameter of the SiC ingot 6 starts to be reduced in the crystal growth direction P, that is, the thickness position U is preferably located closer to a rim portion Re (connection position of the truncated cone portion 6A and the head portion 6B) of the curved surface R, on the seed crystal 5 side of the rim portion. That is, the thickness position U is preferably located at a position slightly apart from the position, where the diameter of the SiC ingot 6 is the largest, to the seed crystal side. In this case, the thickness position U is set in the vicinity of the end portion of the truncated cone portion 6A. The cut-out head member 40 is a portion including the head portion 6B and a part of the end portion of the truncated cone portion 6A.

Next, the head member 40 obtained as described above is treated such that a mirror surface is formed by polishing a silicon surface (Si surface) Fs thereof which is a surface opposite to the curved surface R (carbon surface). In this way, a sample for evaluation is formed.

Before polishing the silicon surface (Si surface) Fs of the head member 40, it is preferable that a portion including the distal end Rt of the curved surface R is grinded to a predetermined thickness in advance, and a flat surface Fc is formed in head the member.

By this step, the curved surface R side which is a lower surface can be stably fixed to a polishing machine, when the silicon surface (Si surface) Fs is polished. The area of the flat surface Fc at this time is preferably 5% or more of the area of the silicon surface (Si surface) Fs. An upper limit value of the area can be optionally selected, and may be, for example, 70% or less, 50% or less, 30% or less, or 10% or less.

In addition, a sample supporting member 50 including a supporting surface S which has a shape of the curved surface R of the head member 40 may be prepared in advance. It is also preferable that the curved surface R of the head member 40 is supported on the supporting surface S of the sample supporting member 50, and then, the silicon surface (Si surface) Fs is polished to form a mirror surface. The shape of the head member 40 is different for each sample of the SiC ingot 6. Accordingly, a material having flexibility such as an epoxy resin is preferably used, as the material of the sample supporting member 50.

Using the sample for evaluation obtained as described above, which has a semi-ellipse cross section, the etching or the like with potassium hydroxide can be performed to grasp a specific crystal dislocation density or distribution thereof of the SiC ingot 6.

As described above, according to the method of acquiring a sample for evaluation of a SiC single crystal, the head member 40 including the head portion 6B, from which the SiC wafer 45 to be a product cannot be obtained by cutting out due to a small diameter thereof, is cut out. The silicon surface Fs of this head member 40 is polished and used for the quality evaluation of the SiC ingot 6. By this method, the cutting of the portion used in a wafer for evaluation (sample for evaluation) from the truncated cone portion 6A which is a portion, from which the SiC wafer 45 to be a product is cut out, can be minimized. In addition, it is possible to increase a yield of the SiC wafer 45 to be a product and improve productivity. Particularly, a portion which is removed from the distal end side of the truncated cone portion 6A, which has higher quality toward the crystal growth direction P, as the portion used in the wafer for evaluation can be decreased. Accordingly, it is possible to obtain a larger amount of the SiC wafer 45 to be a product having high quality.

As described above, according to the method of the present invention, the head member, from which the SiC wafer to be a product cannot be cut out due to a small diameter, is cut out, and the silicon surface of this head member is polished and used for the quality evaluation of the SIC ingot. Due to the method, a portion used for the sample for evaluation, which is obtained from the portion from which the SiC wafer to be a product can be obtained by cutting out, can be minimized, and it is possible to increase a yield of the SiC wafer to be a product and improve productivity.

Hereinabove, the embodiments of the invention has been described, but these embodiments are merely examples and the scope of the invention is not limited. These embodiments can be performed in various other aspects, and various omissions, replacements, and modifications can be performed within a range not departed from the gist of the invention. These embodiments or modifications thereof are included in the invention described in the claims and the equivalent range thereof, in the same manner as those are included in the scope or the gist of the invention.

EXAMPLES

A head portion was actually cut out from a SiC ingot, based on the method of acquiring a sample for evaluation of a SiC single crystal of the present invention described above. This head portion was polished and used as a sample for evaluation of the SiC ingot.

As a result, one sheet of the SiC wafer, which was used in the related art as a sample for evaluation, was able to be obtained and be used as a product wafer. Particularly, this obtained SiC wafer, which is cut out from the distal end side of a truncated cone portion of the SiC ingot, had high quality. Therefore, one more sheet of the SiC wafer having high quality than that in the related art could be obtained.

Thus, the invention can provide a method of acquiring a sample for evaluation of a SiC single crystal, wherein the method is capable of acquiring a sample for evaluation of a SiC single crystal without reducing the yield of a SiC wafer.

EXPLANATION OF REFERENCES

5: seed crystal
5a: main surface (crystal growth surface) of seed crystal
6: SiC ingot (SiC single crystal)
6A: truncated cone portion
6B: head portion
10: crucible
11: crystal installation portion
12: tapered guide
20: coil
40: head member
45: SiC wafer
50: sample supporting member
Fc: flat surface of head member
Fs: silicon surface of head member
G: raw material
P: crystal growth direction
L1: total length of SiC ingot
L2: length from distal end of curved surface toward seed crystal
R: curved surface
Re: rim portion of curved surface
Rt: distal end of curved surface
S: supporting surface
U: thickness position

The invention claimed is:

1. A method of acquiring a sample for evaluation of a SiC single crystal, comprising:
    a step of cutting a SiC ingot in a radial direction at a thickness position, which is located in a range from a curved surface which forms a distal end surface in a crystal growth direction to a seed crystal, to obtain a dome head member which includes the curved surface, wherein the SiC ingot used in the step is a SiC ingot in which SiC thereof is crystal-grown from the seed crystal along a c axis direction, and wherein the SiC ingot used in the step comprises the dome head member and a truncated cone portion; and a step of polishing a silicon surface of the dome head member to obtain a sample for evaluation.

2. The method of acquiring a sample for evaluation of a SiC single crystal according to claim 1,
wherein the thickness position is located closer to a position, where a diameter of the SiC ingot starts to be reduced in the crystal growth direction, on the seed crystal side of the position.

3. The method of acquiring a sample for evaluation of a SiC single crystal according to claim 1,
wherein distance from the distal end of the curved surface to the thickness position in a crystal growth direction is included in a length range of 1% or more and 30% or less with respect to a total length of the SiC single crystal which is a length between the distal end of the curved surface and the seed crystal.

4. The method of acquiring a sample for evaluation of a SiC single crystal according to claim 3,
wherein the distance from the distal end of the curved surface to the thickness position in a crystal growth direction is included in a length range of 1% or more and 10% or less with respect to the total length of the SiC single crystal.

5. The method of acquiring a sample for evaluation of a SiC single crystal according to claim 3,
wherein the distance from the distal end of the curved surface to the thickness position in a crystal growth direction is included in a length range of 1% or more and 5% or less with respect to the total length of the SiC single crystal.

6. The method of acquiring a sample for evaluation of a SiC single crystal according to claim 3,
wherein the distance from the distal end of the curved surface to the thickness position in a crystal growth direction is included in a length range of 1% or more and 3% or less with respect to the total length of the SiC single crystal.

7. The method of acquiring a sample for evaluation of a SiC single crystal according to claim 1, further comprising:
a step of grinding a portion including the distal end of the curved surface to form a flat surface.

8. The method of acquiring a sample for evaluation of a SiC single crystal according to claim 1, further comprising:
a step of loading the sample for evaluation on a sample supporting member including a supporting surface having a shape of the curved surface.

9. The method of acquiring a sample for evaluation of a SiC single crystal according to claim 1,
wherein the dome head member includes the silicon surface and the curved surface, wherein the silicon surface is a flat surface.

* * * * *